United States Patent [19]

Ash

[11] Patent Number: 4,999,079
[45] Date of Patent: Mar. 12, 1991

[54] PROCESS AND APPARATUS FOR TREATING ARTICLES AND PREVENTING THEIR WRAP AROUND A ROLLER

[75] Inventor: James J. Ash, Centre Hall, Pa.
[73] Assignee: Chemcut Corporation, State College, Pa.
[21] Appl. No.: 360,349
[22] Filed: Jun. 2, 1989
[51] Int. Cl.⁵ .................. C23F 1/02; B08B 3/04; B08B 11/00; B08B 15/00
[52] U.S. Cl. .................. 156/345; 156/638; 156/640; 134/64 R; 134/122 R; 118/114; 118/116
[58] Field of Search ............ 156/638, 640, 345; 134/15, 122 R, 64 R, 199; 118/111, 114, 116, 245; 198/624; 162/205; 100/93 RP

[56] References Cited
U.S. PATENT DOCUMENTS

| | | | |
|---|---|---|---|
| 1,331,463 | 2/1920 | Streeper | 118/245 |
| 1,539,993 | 6/1925 | Conley | 134/64 R |
| 1,587,638 | 6/1926 | Feybusch et al. | 118/245 |
| 3,543,775 | 12/1970 | Bodnar | 134/15 |
| 4,385,967 | 5/1983 | Brady et al. | 204/27 |
| 4,576,685 | 3/1986 | Goffredo et al. | 204/30 |

FOREIGN PATENT DOCUMENTS 2197581  5/1988  United Kingdom .................. 134/15

Primary Examiner—David L. Lacey
Assistant Examiner—Todd J. Burns
Attorney, Agent, or Firm—Paul & Paul

[57] ABSTRACT

A method and apparatus is provided for chemically treating articles, often with a liquid treatment fluid that is corrosive, while the articles are being delivered along a path through a substantially closed chamber. During treatment, the articles pass through a nip formed between opposed rollers. Because of the thin flexible nature of the articles, they may tend to wrap around a roller after passing through the nip. The articles are engaged as they pass downstream of the nip and are urged away from the surface of the roller, to continue to follow a predetermined path of travel. In engaging the articles to urge them away from the nip, they are preferably contacted by eccentrically mounted rings, carried by the roller. The rings have portions that protrude away from the surface of the roller that enables them to engage the article.

14 Claims, 2 Drawing Sheets

PROCESS AND APPARATUS FOR TREATING ARTICLES AND PREVENTING THEIR WRAP AROUND A ROLLER

BACKGROUND OF THE INVENTION

In the manufacture of printed circuit boards, printed circuit elements and like goods, and in processes connected with the same, it has become commonplace to deliver the articles, such as printed circuit boards, printed circuit film or the like, through a chamber in a continuous manner, while the articles are being treated by the spray of a suitable treatment fluid, such as an etchant, onto them. Often the etchant is of a corrosive nature, but on other occasions it can be various chemical solutions or even ordinary rinsing liquid, such as water. See, for example, U.S. Pat. No. 4,233,106, the disclosure of which is herein incorporated by reference.

Especially in instances when the treatment fluids are liquids that are corrosive in nature, it is undesirable to have the liquids pass outwardly of the treatment chamber, because if they did, they would require earlier replenishment than would be desirable, or would require special handling of the treatment liquid that passes outwardly of the chamber. Even further, considerations of costs are involved, in connection with loss of treatment fluid.

In the course of preventing the passage of treatment fluid outwardly of treatment chambers, it has become commonplace to locate a pair of opposed rollers, at least near the exit of the treatment chamber, although in many instances opposed pairs of rollers are located at both the inlet and exit of the treatment chamber, preventing the undesirable passage of treatment liquid out an associated opening of the chamber. In even other instances, opposed roller pairs are provided at various locations throughout the treatment chamber, not related to an opening.

In any event, opposed roller pairs are utilized in treatment chambers to prevent passage of liquid out openings, or to provide a driving means for driving the articles that are treated along their predetermined path through the chamber, generally from inlet to exit, or to both drive the articles and prevent liquid passage.

In the course of known processes, it has been commonplace for rollers to provide a nip between them for squeezing the articles as they pass through the nip, to facilitate removal of the treatment liquid from surfaces of the articles as they pass through the nip. Such rollers are generally referred to as anti-dragout rollers, because they cooperate to prevent the dragging-out of treatment liquid from the chamber at the exit end.

It will be understood that similar, although perhaps less pronounced problems can exist at the inlet end of the chamber, so that similar rollers are often used thereat.

With increased miniaturization in many industries, including the electronics industry, printed circuit articles have become thinner and thinner, such that they are more flexible or film-like than theretofore. The same is true of articles treated with other treatment fluids, not involved with the printed circuit industry.

As articles being treated become increasingly thinner, upon their passing through a nip of opposed rollers, they have a tendency to adhere to the surface of one of the rollers after passing through the nip, and thereafter tend to follow that surface of the rollers such that they leave the predetermined path of travel for such articles and curve around a roller. Often, this is due to the presence of a small amount of treatment liquid that remains on the roller surface and on the article being treated, downstream of the nip, that is sufficient to cause the article and roller surface to adhere together at that point.

Accordingly, the path of travel of articles being treated can be interrupted. This can be especially troublesome in the operation of a continuous process, whereby the operation may become interrupted.

The present invention is directed toward affecting the treatment of articles as described above, in such a way that as articles pass through the nip of an opposed pair of rollers, they are engaged as they pass downstream of the nip and are urged away from a surface of the roller, such that thin, flexible articles emerging from the nip are restrained from adhering to the surface of the roller, whereby wrap-around of the articles relative to the roller can be avoided.

SUMMARY OF THE INVENTION

The present invention is therefore directed toward providing a process and apparatus in which, as articles are delivered along their predetermined path through a zone in which they are being treated by a treatment liquid, they can be engaged by opposed rollers, pass between the nip formed between opposed rollers, and then be further engaged after passing downstream (or in the direction of travel of articles along their predetermined path) of the nip of the rollers and urged away from following a surface of either of the rollers.

Accordingly, it is a primary object of this invention to provide a method and apparatus for treating articles that are thin, generally flexible, with a treatment liquid, in such a way that the articles can pass through the nip formed between a pair of opposed rollers, without adhering to one of the rollers after passing through the nip.

It is a further object of this invention to accomplish the above object by physically engaging the articles being treated after passing through a nip, by means of one or more rings mounted on a roller.

It is yet another object of the present invention to accomplish the above objects, wherein rings are axially spaced along a roller, to engage an article at one or more points, and in which the rings are eccentrically carried by the roller.

It is a further object of this invention to accomplish the above objects, wherein the rings may be arranged and located such that they eccentrically protrude from the surface of the roller downstream of the nip, such that they have the ability to substantially immediately provide an engagement with the articles for restraining them from adhering to a roller as the articles pass through the nip.

Other objects and advantages of the present invention will be readily apparent to those skilled in the art, from a reading of the following brief descriptions of the drawing figures, detailed description of the preferred embodiment, and the appended claims.

BRIEF DESCRIPTION OF THE DRAWING FIGURES

DETAILED DESCRIPTION OF THE PREFERRED EMBODIMENT

Figure 1:
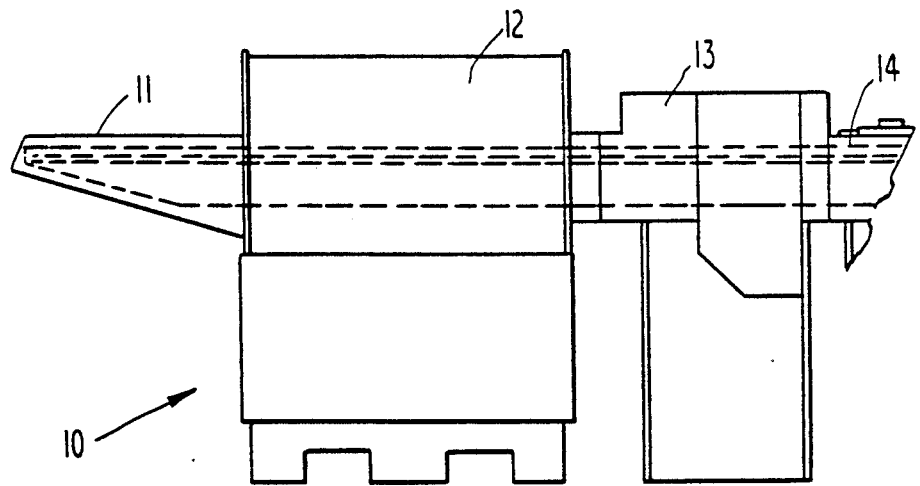
FIG. 1 is a fragmentary vertical elevational view, of an assembly line for continuously treating articles as part of a chemical treatment operation, wherein various treatment fluids may be applied to the articles as they travel along a predetermined path.

Referring now to the drawings in detail, reference is first made to FIG. 1, wherein there is illustrated a continuous treatment system generally designated by the number 10, as including an inlet unit 11, and etching unit 12, a rinsing unit 13, and another treatment unit or station 14 that may comprise additional rinsing, drying, etc., as desired. It will be understood that the system 10 of FIG. 1 is illustrative only, and that such systems can include may different units, modules, or stations.

Generally, the units 11 through 14 will be commonly driven by means of a drive mechanism similar to that set forth in U.S. Pat. No. 4,015,706, the disclosure of which is herein incorporated by reference.

Figure 2:
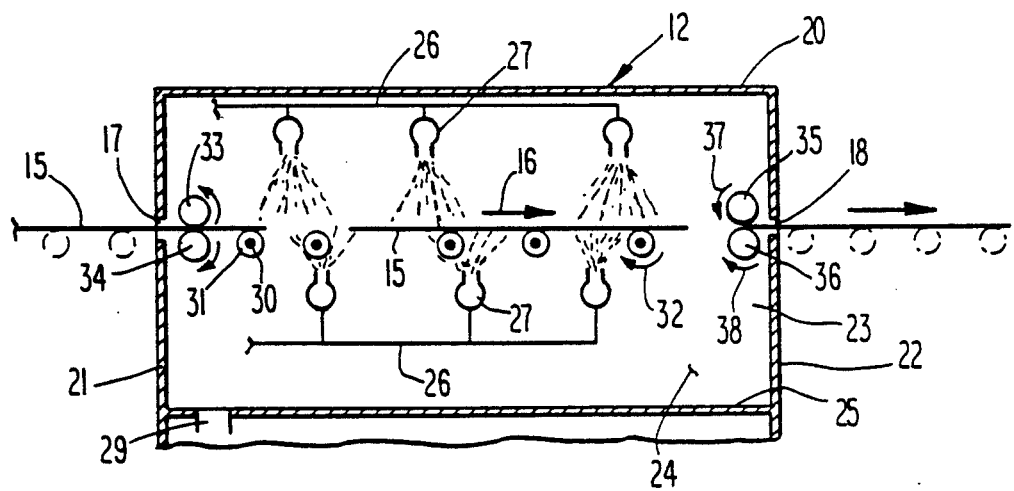
FIG. 2 is a fragmentary vertical sectional view of a portion of a treatment chamber, in which articles have treatment fluid applied thereto as they travel along a predetermined path between inlet and exit openings thereof, with roller pairs having nips therebetween being illustrated at inlet and exit openings thereof.

With particular reference to FIG. 2, it will be seen that the articles 15 being treated in the chamber 12 pass from left to right therethrough in the direction of the arrows 16 of FIG. 2, from an inlet opening 17 to an exit opening 18, as they pass along their path of travel represented by a straight line between said openings.

The chamber 12 is provided with a top wall 20, left and right end walls 21 and 22, respectively, a pair of opposed sidewalls such as 23, spaced apart transversely of the apparatus. The treatment zone 24 at the upper end of the apparatus 12 fragmentally illustrated in FIG. 2 is provided with a bottom wall 25 having a liquid discharge line 29 for removal of liquid from zone 24.

In the treatment station 12 illustrated in FIG. 2, a treatment fluid of the liquid type is delivered from an appropriate source, such as the bottom of the unit 12 (not shown), through delivery lines 26, to appropriate liquid outlets, such as those of the flood bar type 27 illustrated in FIG. 2, from which the etchant or other treatment liquid is dispensed, as shown. Such liquid may be dispensed from above, or from below the path of travel that is defined by a straight line between inlet 17 and exit 18, or may be selectively dispensed from one or more flood bars 27, or any alternative nozzles or the like, as are desired. The treatment liquid may, if desired be delivered in accordance with U.S. Pat. No. 4,650,542, the complete disclosure of which is also herein incorporated by reference. Also, it will be understood that the drive mechanism mentioned above, such as that set forth in U.S. Pat. 4,015,706, or any similar drive mechanism may be employed to drive rods 30 having wheels 31 thereon in a clockwise direction such as that designated by the 32 of FIG. 2, such that articles 15 are driven in the direction of the arrow 16.

Similarly, the above-described drive mechanism may drive opposed pairs of roller 33, 34 and 35, 36, located respectively at inlet and exit openings 17 and 18. Opposed roller pairs will be driven with the rollers of each pair rotating in opposite directions, as shown by the arrows 37 and 38 of FIG. 2, in the preferred embodiment. In such an embodiment, the rollers provide a driving function to the articles being delivered their predetermined path 16, although the same is not essential for the present invention, in that it is conceivable that such rollers may in some instances be idler rollers, for which the present invention is also adapted.

While not shown in FIG. 2, it is also within the purview of the present invention that opposed roller pairs could be at any location between the inlet and outlet openings 17 and 18, and preferably would be driven rollers as well.

Figure 3:
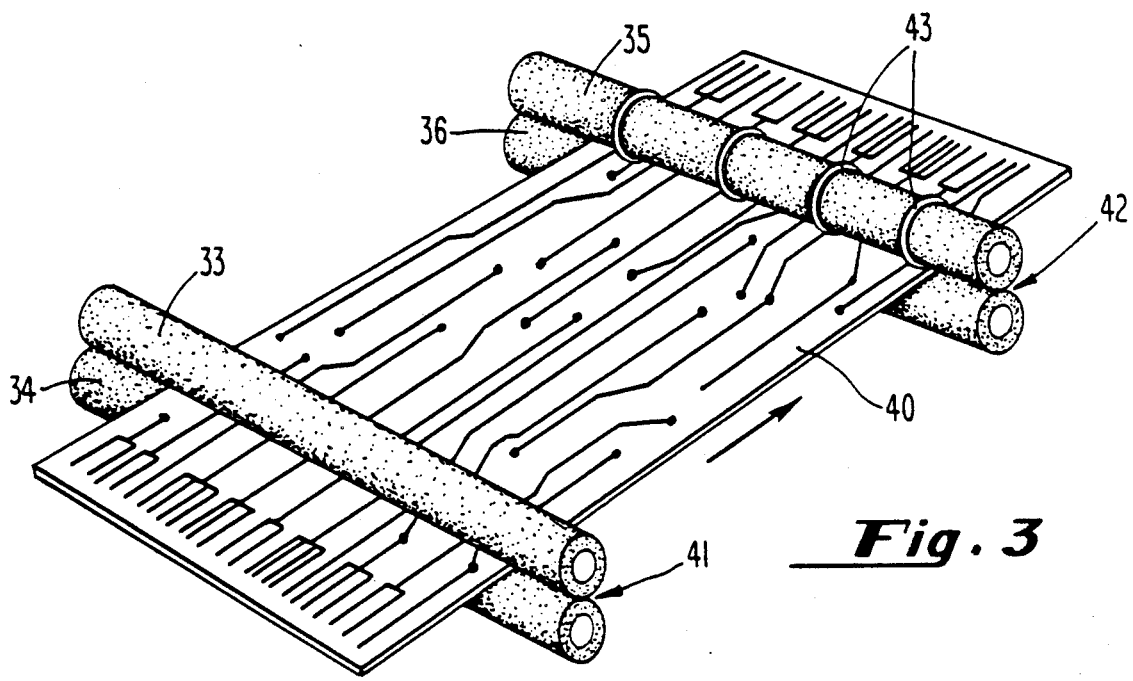
FIG. 3 is an enlarged schematic perspective illustration of inlet and exit roller pairs having nips formed therebetween, in engagement with a printed circuit article, in accordance with this invention.

With particular reference to FIG. 3, the opposed roller pairs 33, 34 and 35, 36, are illustrative in perspective, and in the embodiment of FIG. 3, are shown to be delivering therebetween a long printed circuit article 40. While, as with the illustrations of FIGS. 1 and 2, the drive mechanism for driving the rollers 33–36 is not shown, it will be understood that such will preferably be as referenced in the above-mentioned issued patents.

Roller pair 33, 34 is provided with a nip 41 formed at the location where the opposed rollers meet. Similarly, a nip 42 is provided between pair 35, 36.

If will further be understood that the opposed roller of any given pair can have surfaces that are resilient, such that the rollers will be in pressed-together engagement with each other when no article is passing therebetween, and when an article such as that 40 or 16 is passing therebetween, the surfaces of the rollers may resiliently deflect, or deform somewhat, enough to accommodate the thickness of the article passing therebetween. This may be accomplished by using rollers of an elastomeric or felt-like material, as desired, selected to be suitable in accordance with the conditions imposed by the treatment liquid, such as to resist corrosion or the like. Thus, opposed rollers of any given pair are somewhat "squeezed" together in their normal mounting operation, and when an article passes through the nip formed between such rollers, they will, in turn, squeeze the article, and thereby wipe substantial amounts of the treatment liquid from the surfaces thereof. Such materials of construction of the surfaces of rollers is within the scope of the prior art and need not be repeated here.

Similarly, it is within the scope of the prior art to have one or more of the rollers that form a nip therebetween, resiliently mounted such as spring-biased or gravity mounting (top roller), such that the force thus imposed allows the rollers to be pressed-together to be sealed at the nip against passage of liquid therethrough when no article is passing, and yet to accommodate the thickness of an article being treated, to thereby effect a sealing and wiping function.

Figure 4:
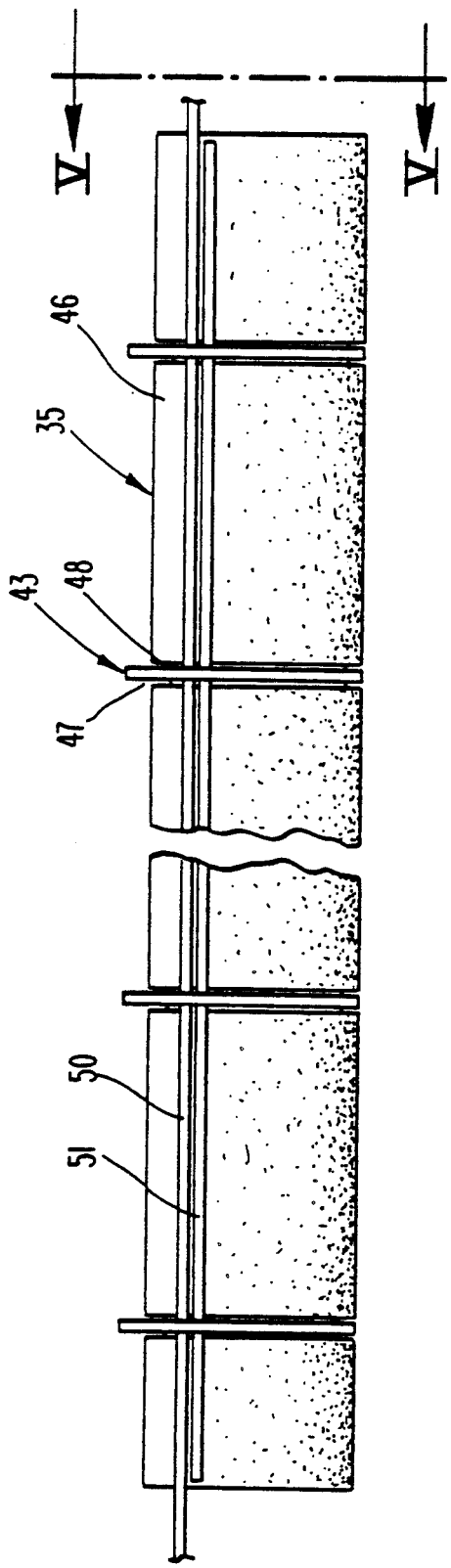
FIG. 4 is an elevational view of the upper roller of the roller pair that forms the nip at the right end of FIG. 3, taken from the right end of FIG. 3, wherein the roller and a plurality of rings, together with a ring mounting rod and a ring weighting rod, are clearly illustrated downstream of the nip of FIG. 3, with the roller being fragmentally illustrated for convenience.

With reference now to FIG. 4, it will be seen that the roller 35 is provided with a plurality of axially spaced-apart rings 43 along the length thereof. The rings 43 may be split, as at 44 in FIG. 5, to accommodate placing them over the cylindrical surface 46 of the roller, into appropriate slots 47 that are axially spaced along the roller, to facilitate assembly.

Preferably the rings 43 will have outer and inner diameters that are somewhat larger, respectively, than the outer diameter of the cylindrical roller 35 and outer diameter 48 of the slots 47 that are formed in the roller 35. By making the rings 43 of a larger diameter as aforesaid this enables an eccentric mounting of the rings 43 to maximize the ability of the rings 43 to engage the articles immediately upon their exiting a nip 42, as shown in FIG. 5, in that the outer surface 43 of such rings may always be maintained to intersect the outer surface 46 of a roller, precisely at the exit of the nip 42, as shown.

Typical of such dimensions will be a roller diameter for the surface 46, of 1.935 inches, a diameter for the slotted portion 47 on the roller of 1.625 inches, an outer diameter for the ring 43 of 2.062 inches, and an inner diameter for the ring of 1.770 inches, leaving a dimension of 0.145 inches for play or float between the diametrical surface 48 and the inner diameter of the ring 43. It will be understood that, in accordance with the present invention, the use of rings on a roller would still work if the rings are of the same outer diameter a that of the roller, as long as they are eccentrically mounted such that, at some point on the downstream side of the nip, the rings will project outwardly beyond the outer surface of the roller, to push an article that may otherwise be tending to wrap itself around the roller surface 46 (as is shown in phantom in FIG. 5 at 49, for example), away therefrom.

Figure 5:
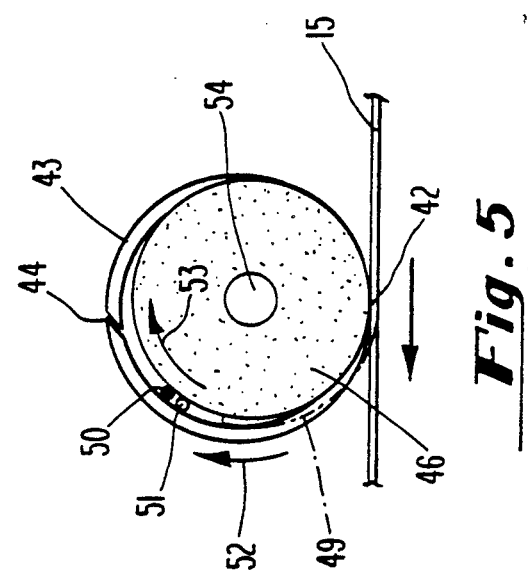
FIG. 5 is an end view of the roller of FIG. 4, taken generally along the line V—V of FIG. 4, and wherein the protrusion of the rings beyond the surface of the roller on the downstream side of the nip, is more clearly illustrated, as is the arrangement of the mounting and weighting rods associated with the rings.

The rings 43 are maintained in the approximate position therefore in FIGS. 4 and 5, by means of rods 50 and 51. Rod 50 is anchored in spaced-apart sidewalls 23 of the apparatus, extending generally parallel with the axis of the roller, as shown, but downstream thereof as viewed in FIG. 5 in order to mount the rings such that their outer surfaces protrude beyond the outer surface of the roller a maximum amount on the downstream side of the roller, as shown in FIG. 5. The rod 50 is thus fixedly mounted (not shown), and the rings 43 are caused to rotate thereabout, due to the rotation of the roller 46 in the direction of the arrows 52 and 53 illustrated in FIG. 5. The rod 51 is a weight-applying member, whereby a single rod may serve to maintain a force or weight against the inside diameters of the rings, as a gravity-applied force, in order to facilitate keeping the rings as shown in FIG. 5 such that, substantially immediately downstream of the nip 42, they project outwardly beyond the surface 46 of the roller.

It will apparent from the foregoing that, while the use of rings and their mounting is preferable as a technique for constantly engaging articles that are passing through a nip such as that 42 formed between an opposed roller pair, any other means that physically engages the articles and keeps them from wrapping around the roller as they exit the nip is within the broadest aspects of this invention. Also, when rings such as those disclosed herein are used to accomplished this purpose, it will be understood that any other manner of maintaining the eccentric positioning of the rings relative to the axis or center 54 of the associated cylindrical roller 35 will suffice, within broader aspects of the invention. Also, it will be understood, that where some form of weighting device is to be utilized, means other than the rod 51, such as spring-biased arrangements or the like may be utilized, all within the spirit and scope of the invention as defined the appended claims.

What is claimed is:

1. A process for chemically treating flexible, generally flat discrete articles that have leading and trailing edges and which are sufficiently thin to have a tendency to wrap around a nip roller when leaving a roller nip in the presence of a liquid, when the treatment is in a chamber with a liquid treatment fluid, wherein the fluid is applied to articles being delivered along a path of travel for the articles, the process comprising the steps of:
   (a) providing a substantially closed chamber for treating articles therein;
   (b) serially delivering the articles along a path of travel through the chamber;
   (c) applying a liquid treatment fluid to the articles being delivered along their path of travel through the chamber;
   (d) engaging the articles in a nip between opposed rotating cylindrical surfaced roller members in the chamber to keep treatment fluid that is being applied to the articles in the chamber from passing downstream of the nip; and
   (e) contacting the thin flexible discrete articles as their leading edges pass downstream of and while close to the nip of the roller members and urging the articles away from a surface of one of said roller members to restrain the thin, flexible articles coming out of the nip from adhering to the surface of said roller member.

2. The process of claim 1, wherein the contacting and urging step includes contacting the articles with at least one ring member and eccentrically carrying the ring member(s) on one of said roller members to project outwardly of the cylindrical surface of said roller member downstream of the nip.

3. The process of claim 1, wherein the contacting and urging step includes contacting the articles with a plurality of axially spaced-apart ring members and eccentrically carrying the ring members on one of said roller members to project outwardly of the cylindrical surface of said roller member.

4. The process of claim 2, wherein the step of eccentrically carrying the ring member(s) includes:
   (a) providing the ring member(s) having larger outside diameter(s) than the outside diameter of said roller member;
   (b) mounting the ring member(s) on a fixed rod disposed outside of the cylindrical surface of said roller member downstream of the nip and radially inside the ring member(s); and
   (c) weighting the ring member(s) toward the nip by an acruately movable rod carried outside the cylindrical surface of said roller member and radially inside the ring member(s).

5. The process of claim 3, wherein the step of eccentrically carrying the ring members includes:
   (a) providing the ring members having larger outside diameters than the outside diameter of said roller member;
   (b) mounting the ring member on a fixed rod disposed outside of the cylindrical surface of said roller member downstream of the nip and radially inside the ring members; and
   (c) weighting the ring members toward the nip by an arcuately movable rod carried outside the cylindrical surface of said roller member and radially inside the ring members.

6. The process of any one of claims 1 through 3, wherein the chamber is provided with inlet and exit openings, wherein the articles are delivered along their path of travel between the inlet and exit openings and wherein treatment fluid is kept from passing outwardly of the chamber through a given one of the openings while the article being treated is passing through the opening, by locating the opposed roller members so that their nip is adjacent the given one of the openings.

7. The process of claim 4, wherein the chamber is provided with inlet and exit openings, wherein the articles are delivered along their path of travel between the inlet and exit openings and wherein treatment fluid is kept from passing outwardly of the chamber through a given one of the openings while the article being treated is passing through the opening, by locating the opposed roller members so that their nip is adjacent the given one of the openings.

8. Apparatus for chemically treating flexible, generally flat discrete articles that have leading and trailing edges and which are sufficiently thin to have a tendency to wrap around a nip roller when leaving a roller nip in the presence of a liquid, when the treatment is in a chamber with a liquid treatment fluid, wherein the fluid is applied to articles being delivered along a path of travel for the articles, the apparatus comprising:
   (a) means providing a substantially closed chamber for treating articles therein;
   (b) means for serially delivering the articles along a path of travel through the chamber;
   (c) means for applying a liquid treatment fluid to the articles being delivered along their path of travel through the chamber;
   (d) means comprising opposed rotating cylindrical surfaced roller members mounted in the chamber to engage the articles in a nip therebetween to keep treatment fluid that is being applied to articles in the chamber from passing downstream of the nip; and
   (e) means for contacting the flexible discrete articles as their leading edges pass downstream of and while close to the nip of the roller members and urging the articles away from a surface of one of said roller members to restrain the flexible articles coming out of the nip from adhering to the surface of said roller member.

9. The apparatus of claim 8, wherein the contacting and urging means includes at least one ring member having a larger outside diameter than the outside diameter of said roller member and means eccentrically carrying the ring member(s) on one of said roller members to project outwardly of the cylindrical surface of said roller member downstream of the nip.

10. The apparatus of claim 8, wherein the contacting and urging means includes a plurality of axially spaced-apart ring members, each ring member having a larger outside diameter than the outside diameter of said roller member and means eccentrically carrying the ring members on said roller member to project outwardly of the cylindrical surface of said roller member downstream of the nip.

11. The apparatus of claim 9, wherein the means eccentrically carrying the ring member(s) includes:
   (a) means mounting the ring member(s), including a fixed rod disposed outside of the cylindrical surface of said roller member downstream of the nip and radially inside the ring member(s); and
   (b) means weighting the ring member(s) toward the nip including an arcuately moveable rod carried outside the cylindrical surface of said roller member and radially inside the ring member(s).

12. The apparatus of claim 10, wherein the means eccentrically carrying the ring members includes:
   (a) means mounting the ring members, including a fixed rod disposed outside of the cylindrical surface of said roller member downstream of the nip and radially inside the ring members; and
   (b) means weighting the ring members toward the nip including an arcuately moveable rod carried outside the cylindrical surface of said roller member and radially inside the ring members.

13. The apparatus of any one of claims 8 through 10, wherein the chamber is provided with inlet and exit openings, wherein means are provided for delivering the articles along their path of travel between the inlet and exit openings and wherein the opposed roller members are so mounted for keeping treatment fluid from passing outwardly of the chamber through a given one of the openings while the article being treated is passing through the opening, including the location of the opposed roller members so that their nip is adjacent the given one of the openings.

14. The apparatus of claim 11, wherein the chamber is provided with inlet and exit openings, wherein means are provided for delivering the articles along their path of travel between the inlet and exit openings and wherein the opposed roller members are so mounted for keeping treatment fluid from passing outwardly of the chamber through a given one of the openings while the article being treated is passing through the opening, including the location of the opposed roller members so that their nip is adjacent the given one of the openings.

* * * * *